(12) United States Patent
Yokotani

(10) Patent No.: US 8,643,332 B2
(45) Date of Patent: Feb. 4, 2014

(54) BATTERY SYSTEM AND METHOD FOR DETECTING INTERNAL SHORT CIRCUIT IN BATTERY SYSTEM

(75) Inventor: Kazunobu Yokotani, Kakogawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 358 days.

(21) Appl. No.: 12/974,369

(22) Filed: Dec. 21, 2010

(65) Prior Publication Data
US 2011/0148426 A1    Jun. 23, 2011

(30) Foreign Application Priority Data

Dec. 22, 2009  (JP) ................................ 2009-291490

(51) Int. Cl.
*H02J 7/00* (2006.01)
*H02J 7/04* (2006.01)

(52) U.S. Cl.
USPC ......................................... 320/116; 320/152

(58) Field of Classification Search
USPC ................................................ 320/116, 152
See application file for complete search history.

(56) References Cited

U.S. PATENT DOCUMENTS

| | | | | |
|---|---|---|---|---|
| 5,633,573 | A * | 5/1997 | van Phuoc et al. | 320/128 |
| 5,945,805 | A * | 8/1999 | Takei et al. | 320/124 |
| 6,300,763 | B1 * | 10/2001 | Kwok | 324/427 |
| 7,463,008 | B2 | 12/2008 | Takahashi | |
| 7,560,901 | B2 * | 7/2009 | Fujikawa et al. | 320/134 |
| 7,843,168 | B2 * | 11/2010 | Tsukamoto et al. | 320/116 |
| 2002/0109506 | A1 | 8/2002 | Kawakami et al. | |
| 2006/0186859 | A1 * | 8/2006 | Fujikawa et al. | 320/134 |
| 2009/0289598 | A1 * | 11/2009 | Tsukamoto et al. | 320/118 |
| 2010/0188050 | A1 * | 7/2010 | Asakura et al. | 320/136 |

FOREIGN PATENT DOCUMENTS

| | | |
|---|---|---|
| JP | 2001-006750 | 1/2001 |
| JP | 2002-50410 | 2/2002 |
| JP | 2006-345660 | 12/2006 |
| JP | 2007-240234 | 9/2007 |
| JP | 2008-199723 | 8/2008 |

* cited by examiner

*Primary Examiner* — M'Baye Diao
(74) *Attorney, Agent, or Firm* — Wenderoth, Lind & Ponack, L.L.P.

(57) ABSTRACT

A battery system includes a battery pack, a detecting portion, a storage portion, and a determining portion. The battery pack includes serially-connected parallel battery units each of which includes battery cells connected in parallel. The detecting portion detects voltage and current of the units, and calculates the accumulated current value of each of the units. The storage portion stores reference voltage values to be associated the accumulated current value of each of the units. The determining portion reads, from the storage portion, one of the reference voltages corresponding to the accumulated value of each of the units, and compares the read reference voltage with the detection voltage of the each of the units. Thus, a battery cell internal short circuit is detected if the difference between the detection voltage and the read reference voltage exceeds a threshold.

7 Claims, 5 Drawing Sheets

BATTERY SYSTEM AND METHOD FOR DETECTING INTERNAL SHORT CIRCUIT IN BATTERY SYSTEM

BACKGROUND OF THE INVENTION

1. Field of the Invention

The present invention relates mainly to a battery system and a method for detecting an internal short circuit in a battery system capable of being suitably used as a vehicle power supply device that supplies electric power to an electric motor for driving a vehicle, and in particular to a battery system and a method for detecting an internal short circuit in a battery system that includes a number of battery cells that are connected to each other in series and in parallel to increase output current and battery capacity.

2. Description of the Related Art

In the case where a battery system includes battery cells that are serially connected to each other, the output voltage of the battery system can be high. Also, in the case where a battery system includes battery cells that are connected in parallel to each other, the total amount of output current and the charged capacity can be high. Accordingly, in the case of a battery system that is required to have high output and high capacity for supplying power to an electric motor for driving a vehicle, a number of battery cells are connected to each other in series and in parallel. This type of battery system is discharged and supplies electric power to the electric motor when the electric motor accelerates or drives the vehicle, and is charged by an electric generator or an external charger if the remaining capacity of the battery system is low. In addition, the battery system is charged by the electric generator in vehicle regenerative braking. For the battery system that includes battery cells that are connected in parallel to each other, and has high capacity capable of providing a large amount of current, it is important to uniformly flow currents in the battery cells connected in parallel to each other so that the battery cells operate in uniform states. The reason is that the unbalance among the battery cells may deteriorate a particular battery cell.

A power supply device has been developed that can equalize currents flowing batteries connected to each other in series (Japanese Patent Laid-Open Publication No. 2006-345660).

In the battery system disclosed in JP-2006-345660-A, series battery units each of which includes a number of battery cells serially connected to each other are connected to each other in parallel.

In the battery system, a constant current circuit is connected to each series battery unit to uniformly flow a current in each series battery. Thus, the battery system can uniformly flow currents in the series battery units.

In the battery system, the risk of an internal short circuit will increase in a particular battery cell as a number of battery cells are used longer. Such an internal short circuit may occur in a battery cell in various states. For example, if an internal short circuit occurs caused by a metal fragment that enters a battery cell case, a large amount of short circuit current will flow. Accordingly, it is relatively easily detect such a strong internal short circuit. The reason is that such a strong internal short circuit causes a remarkable voltage drop, or generates heat.

However, in the case where a battery cell is repeatedly charged/discharged, a very small short circuit may occur. In the case where a battery cell is repeatedly charged/discharged, for example, a deposit will deposit on the surface of a positive or negative terminal and may pierce a separator so that a very small short circuit may occur. Since this type of very small short circuit may occur due to a very small deposit, this very small deposit will melt and break due to heat generated by a short circuit current flowing in the deposit. For this reason, such a very small deposit will not continuously create a short circuit. Since this type of very small short circuit will not continuously occur and will create only a very small amount of short circuit current, it is difficult to determine whether a very small short circuit occurs or not.

In addition, in the battery system that includes a plurality of battery cells connected to each other in parallel, it is more difficult to determine whether a very small short circuit occurs in a particular battery cell or not. The reason is that, even when an internal short circuit occurs in one battery cell so that the voltage of the one battery cell drops, a current flows into the one battery cell from other battery cells connected to the one battery cell in parallel so that voltages of the battery cells are equalized.

If a very small internal short circuit repeatedly or continuously occurs, this may finally cause a strong internal short circuit and generate heat, which in turn may bring the battery system in a worse state. In addition, in the case where battery cells are connected to each other in parallel, current will flow into a battery cell in that a very small internal short circuit occurs. This may increase the amount of generated heat. As a result, the battery system may be brought in a still worse state.

From this viewpoint, in the battery system that includes a plurality of battery cells connected to each other in parallel, if it can be determined that an internal short circuit occurs in a battery cell, before the battery system is brought in a worse state, it is possible to restrict the use of the battery system, for example, engine starting is only allowed and the vehicle running by the battery system (i.e., charging/discharging operation) is not allowed. Optionally, "Battery Problem", "Drive to Service Garage" or the like can be indicated to users. This allows users to more safely use the battery system.

However, the battery system disclosed in JP-2006-345660-A cannot equalize currents in battery cells that compose the series battery unit, and cannot determine whether an internal short circuit occurs in a battery cell or not. For this reason, there is a problem in that safe charging/discharging operation cannot be surely assured if an internal short circuit occurs in a battery cell.

The present invention is aimed at solving the problem. It is an important object of the present invention is provide a battery system, and a method for detecting an internal short circuit in a battery system that includes battery cells that are connected to each other in parallel to increase an output current and a battery capacity, and reliably determines whether an internal short circuit occurs in a battery cell among the battery cells, which are connected to each other in parallel, whereby assuring higher safety.

SUMMARY OF THE INVENTION

To achieve the above object, a battery system according to a first aspect includes a battery pack, a detecting portion, a storage portion, and a determining portion. The battery pack includes parallel battery units. Each of the parallel battery units includes a plurality of battery cells that are connected to each other in parallel. The parallel battery units are serially connected to each other. The detecting portion detects voltage and current of each of the parallel battery units. In addition, the detecting portion calculates the accumulated current value of each of the parallel battery units. The storage portion stores reference voltage values to be associated the accumulated current value of each of the parallel battery units calculated by the detecting portion. The determining portion reads, from the storage portion, one of the reference voltages corresponding to the accumulated value of each of the parallel battery units detected by the detecting portion. In addition, the determining portion compares the read reference voltage with the detection voltage of the each of the parallel battery units detected by the detecting portion. Thus, the determining portion determines that a battery cell internal short circuit occurs if the difference between the detection voltage and the read reference voltage is larger than a predetermined value. Although, conventionally, it has been difficult to detect an internal short circuit in battery cells that are connected to each other in parallel, this battery system can effectively detect an internal short circuit in battery cells that are connected to each other in parallel.

In a battery system according to a second aspect, the detecting portion can detect the accumulated current value of the current of the each of the parallel battery units for a predetermined time period, a period from the start to the end of charging operation, a period from the start to the end of discharging operation, or a period in that the accumulated current value of the current of the each of the parallel battery units reaches a predetermined value so that it can be determined whether a battery cell internal short circuit occurs.

In a battery system according to a third aspect, the accumulated value of the current of the each of the parallel battery units detected by the detecting portion can be a remaining capacity that is obtained by multiplying of an integrated value of the current by a correction coefficient.

In a battery system according to a fourth aspect, the battery cells can be lithium-ion rechargeable batteries.

In a battery system according to a fifth aspect, the battery pack can be a power supply that supplies electric power to an electric motor for driving a vehicle.

A battery system according to a sixth aspect includes a battery pack, a detecting portion, and a determining portion. The battery pack includes parallel battery units. Each of the parallel battery units includes a plurality of battery cells that are connected to each other in parallel. The parallel battery units are serially connected to each other. The detecting portion detects voltages of the parallel battery units. The determining portion compares a voltage of one of the parallel battery units detected by the detecting portion with voltages of other of the parallel battery units to detect the voltage difference, and determines that a battery cell internal short circuit occurs in the one of the parallel battery units if the voltage difference is larger than a predetermined value.

A battery cell internal short circuit detection method according to an eighth aspect for detecting a battery cell internal short circuit in a battery system includes a detection step, a calculation step, a reading step, a comparison step, and a determination step. The battery system includes a battery pack that has serially-connected parallel battery units each of which includes a plurality of battery cells connected to each other in parallel. In the detection step, voltage and current of each of the parallel battery units are detected by a detecting portion. In the calculation step, the accumulated current value of each of the parallel battery units is calculated. In the reading step, from a storage portion that stores reference voltages, one of the reference voltages corresponding to the accumulated value of each of the parallel battery units is read. In the comparison step, the read reference voltage is compared with the detection voltage of the each of the parallel battery units detected by the detecting portion. In the determination step, it is determined that a battery cell internal short circuit occurs if the difference between the detection voltage and the read reference voltage is larger than a predetermined value. Although, conventionally, it has been difficult to detect an internal short circuit in battery cells that are connected to each other in parallel, this method can effectively detect an internal short circuit in battery cells that are connected to each other in parallel.

The thus-constructed battery system can increase an output current and a battery capacity by employing battery cells that are connected to each other in parallel, and can reliably determine whether an internal short circuit occurs in a battery cell among the battery cells, which are connected to each other in parallel, whereby assuring higher safety. The operation of this battery system that can detect a very small internal short circuit in a battery cell is described with reference to FIG. 5. In this Figure, it is assumed that a very small internal short circuit occurs in the center battery cell. Since a current will flow from battery cells on the both sides into the center battery cell in that a very small internal short circuit occurs, the voltage drop rate of the center battery cell is small. For this reason, it is not easy to detect occurrence of very small internal short circuit. In particular, such a very small internal short circuit in a battery cell does not always continuously occur but may temporarily occur in repeated charging/discharging operations. For this reason, if a very small internal short circuit temporarily occurs, it is difficult to detect this very small internal short circuit. However, an internally short-circuited battery cell has an actual charged capacity different from a normal battery cell. In addition, an internally short-circuited battery cell has an actual charged capacity corresponding to its actual charged capacity different from a normal battery cell. That is, the voltage of an internally short-circuited battery cell varies differently from a normal battery cell under charging operation. Also, deviation of the voltage variation state of an internally short-circuited battery varies depending on the state of the battery cell. For example, in the case where a charging current is bypassed in the battery cell by an internal short circuit, currents decrease that flow in the battery cells on the both sides. In this case, the voltage rise of a parallel battery that includes such an internally short-circuited battery cell will be lower.

On the other hand, under battery pack discharging operation, in a parallel battery unit that includes the center battery cell the remaining capacity of which is reduced by the internal short circuit, since the discharged capacity from the battery cells on the both sides is larger, the voltage reduction of this parallel battery unit will be larger relative to the discharged capacity of this parallel battery unit. As discussed above, in a parallel battery unit that includes an internally short-circuited battery cell, under charging operation and discharging operation, the variation ratio of its voltage relative to its charged capacity is different from a normal parallel battery unit.

The aforementioned battery system stores the variation of voltage relative to capacity of a normal parallel battery unit under charging operation and discharging operation, specifically stores reference voltages as normal variation of voltage relative to capacity. In battery pack charging/discharging operation, a charged or discharged capacity, and a voltage of a parallel battery unit are detected. In a parallel battery unit in that an internal short circuit does not occur in any of the battery cells, its detected voltage agrees with the reference voltage. However, in a parallel battery unit in that an internal short circuit occurs in any of the battery cell, since its actual charged/discharged capacity is deviated due to the internal short circuit, its detected voltage or the variation amount of its voltage will be different from the reference voltage or the reference voltage variation amount. For this reason, after the charged/discharged capacity and voltage of a parallel battery unit are detected, the reference voltage corresponding to the detected charged/discharged capacity is compared with the detected voltage corresponding to the detected charged/discharged capacity, alternatively, the variation amount of detected voltage corresponding to the detected charged/discharged capacities is compared with the voltage variation reference amount corresponding to the detected charged/discharged capacities. As a result, it is possible to detect a battery cell internal short circuit. in particular, in the case where battery system not only compares the reference voltage with the detected voltage of the parallel battery unit, but also compares the variation amount of detected voltage of the parallel battery unit with variation amount of reference voltages corresponding to the detected charged/discharged capacities, it is possible to reliably detect even a very small battery cell internal short circuit, and to safely charge/discharge the battery pack. The reason is that, even if currents flow from the battery cells on the both sides into the internally short-circuited battery cell so that voltages of the battery cells in a parallel battery unit are equalized, such a very small battery cell internal short circuit can be detected.

The above and further objects of the present invention as well as the features thereof will become more apparent from the following detailed description to be made in conjunction with the accompanying drawings.

DETAILED DESCRIPTION OF THE INVENTION

The following description will describe an embodiment according to the present invention with reference to the drawings.

Figure 1:
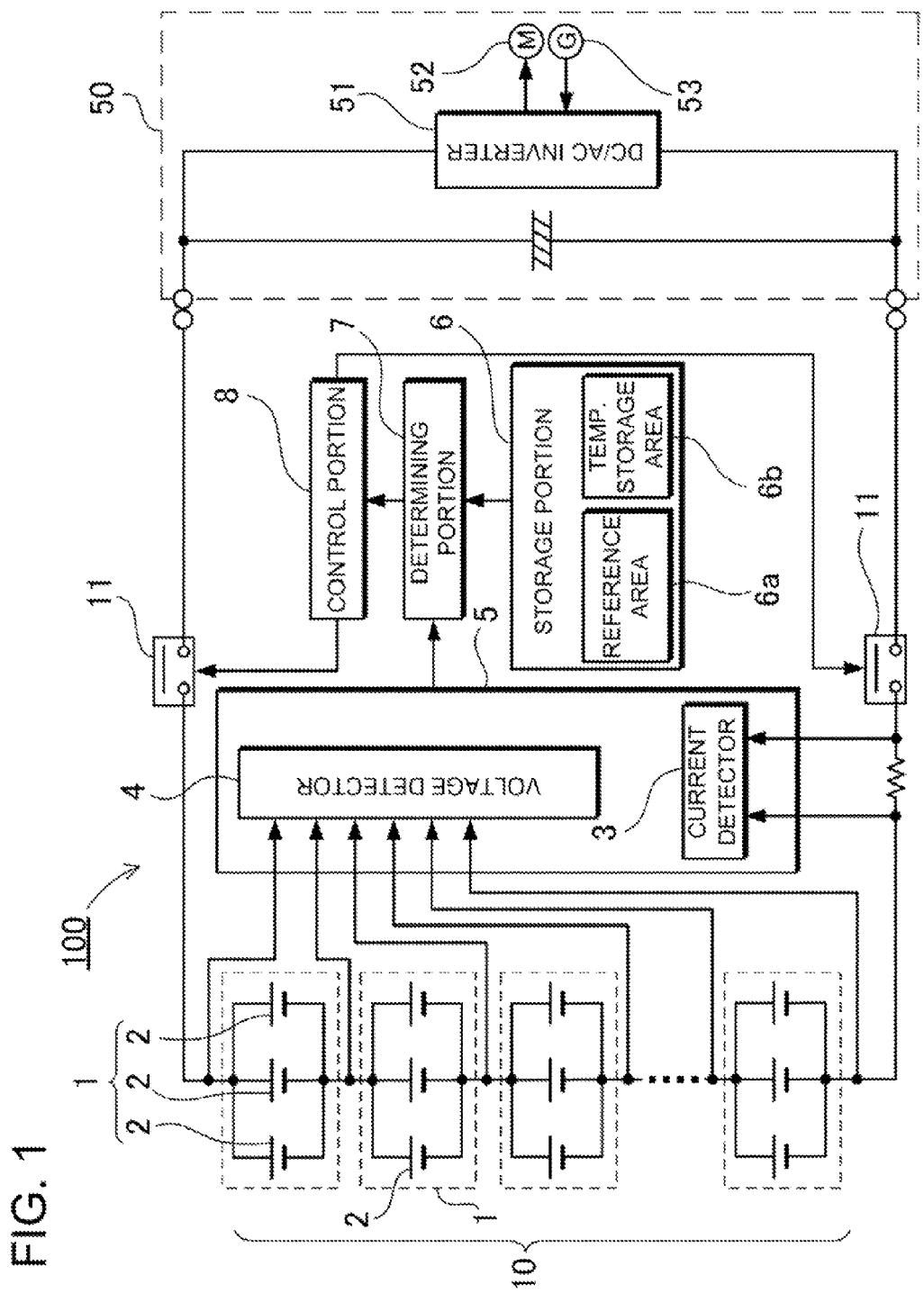
FIG. 1 is a block diagram showing a power supply device according to one embodiment of the present invention.
Figure 2:
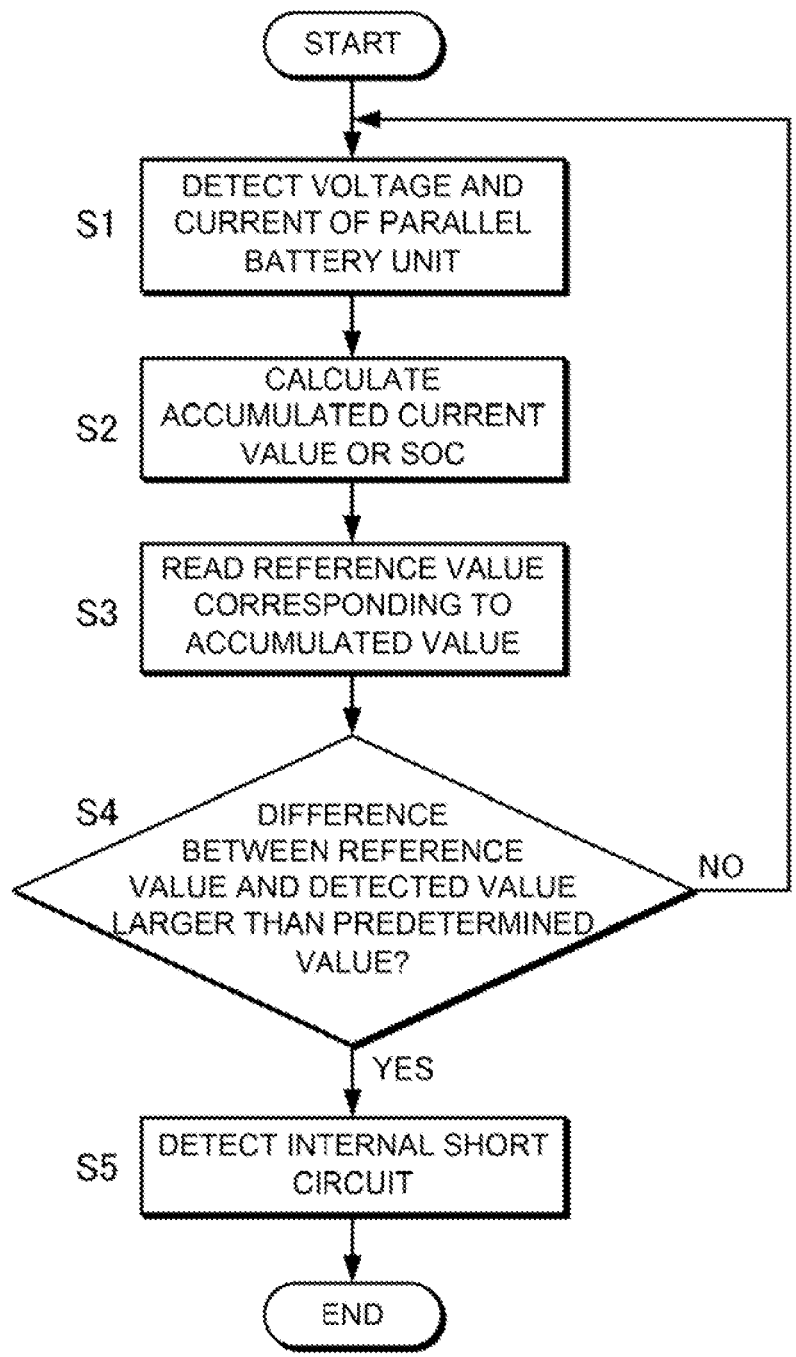
FIG. 2 is a flowchart showing the procedure of detecting a very small internal short circuit.

The following description will describe a battery system according to the embodiment of the present invention with reference to FIGS. 1 to 2. In this embodiment, the present invention is applied to a vehicle power supply device. FIG. 1 shows a block diagram of the power supply device. FIG. 2 shows a flowchart of the procedure for detecting a very small internal short circuit. A power supply device 100 shown in these Figures is suitable mainly for power supplies of electric vehicles such as hybrid cars that are driven by both an engine and an electric motor, and electric vehicles that are driven only by an electric motor. However, the power supply device according to the present invention can be used for vehicles other than hybrid cars or electric vehicles, and can be also used for applications other than electric vehicle that require high power.

The vehicle power supply device 100 shown in FIG. 1 is installed in a vehicle such as hybrid car, fuel-cell vehicle and electric vehicle, and is connected to an electric motor 52 in a vehicle load 50. The electric motor 52 is powered by the vehicle power supply device 100, and drives the vehicle. As shown in FIG. 1, the vehicle load 50 includes a DC/AC inverter 51, the electric motor 52 and an electric generator 53. The DC/AC inverter 51 is connected on the input side. The electric motor 52 and the electric generator 53 are connected on the output side. The DC/AC inverter 51 converts direct current from a vehicle-driving battery 1 into three-phase alternating current, and controls power supplied to the electric motor 52. In addition, the DC/AC inverter 51 converts output from the electric generator 53 into direct current so that the vehicle-driving battery 1 of the power supply device 100 is charged.

A vehicle load can be used that includes a buck-boost converter connected on the input side of the DC/AC inverter. This buck-boost converter boosts the output voltage of the power supply device, and provides the boosted voltage to the electric motor. In this vehicle load, the output voltage of the power supply device is boosted by buck-boost converter, and is provided to the electric motor via the DC/AC inverter, while the output from the electric generator is converted into direct current by the DC/AC inverter, and is reduced in voltage by the buck-boost converter to charge the battery.

The vehicle power supply device 100 shown in FIG. 1 includes a battery pack 10, a current detecting circuit 3, a voltage detecting circuit 4, a determining portion 7, a reference area 6a, contactors 11, and a control portion 8. The battery pack 10 supplies electric power to the electric motor 52 of the vehicle load 50. The current detecting portion 3 detects a current of the battery pack 10. The voltage detection portion 4 detects voltages of battery cells 2. The determining portion 7 determines, based on the detection voltages detected by cell voltage detecting circuit 4 and the detection current detected by the current detecting circuit 3, whether a battery cell 2 internal short circuit occurs. The reference area 6a stores reference information. The control portion 8 opens/closes the contactors 11.

The current detecting circuit 3 and the voltage detecting circuit 4 composes a detecting portion 5 that detects voltages and currents of parallel battery units 1, and calculates the accumulated current value of each of the parallel battery units 1. The determining portion 7 reads, from the reference area 6a, one of the reference voltages corresponding to the accumulated value of each of the parallel battery units 1 detected by the detecting portion 5, and compares the read reference voltage with the detection voltage of the each of the parallel battery units 1 detected by the detecting portion 7 whereby determining that a battery cell 2 internal short circuit occurs if the difference between the detection voltage and the read reference voltage is larger than a predetermined value.

(Storage Portion 6)

A storage portion 6 includes the reference area 6a, and a temporary storage area 6b. The reference area 6a stores reference voltage values to be associated the accumulated current value of each of the parallel battery units 1 calculated by the detecting portion 5. A non-volatile memory such as ROM and $E^2PROM$ can be used as the reference area 6a. The temporary storage area 6b temporarily stores data. A volatile memory such as RAM can be used as the temporary storage area 6b. Although the storage portion 6 is constructed separately from the determining portion 7 in the embodiment shown in FIG. 1, needless to say, the storage portion 6 can be constructed as the same member as the determining portion 7. For example, a chip, IC, or the like with a semiconductor memory element mounted in a single package can be used.

The reference area 6a of the storage portion 6 stores reference data of the relationship between voltage value variation and current integrated value variation that has been previously obtained based on measured experimental results. The reference data can be stored in a form of table or calculation formula.

(Detecting Portion 5)

The detecting portion 5 detects the voltage and current of each of the parallel battery units 1. In addition, the detecting portion 5 also calculates the voltage value variation and the current integrated value (or SOC) variation. The accumulated value of the current of each of the parallel battery units 1 detected by the detecting portion 5 is a remaining capacity that is obtained by multiplying of an integrated value of the current by a correction coefficient.

The detecting portion 5 can detect the accumulated current value of the current of the each of the parallel battery units 1 for a predetermined time period, a period from the start to the end of charging operation, a period from the start to the end of discharging operation, or a period in that the accumulated current value of the current of the each of the parallel battery units 1 reaches a predetermined value so that it is determined whether a battery cell 2 internal short circuit occurs.

In this embodiment, although the detecting portion calculates the voltage value variation and the current integrated value variation, the determining portion may calculate the voltage value variation and the current integrated value variation. The detecting portion and the determining portion can be constructed as separated members. Alternatively, they may be integrally constructed.

(Determining Portion 7)

The determining portion 7 determines whether a battery cell 2 very small internal short occurs or not based on the actually-detected values detected by the detecting portion 5, and the reference data stored in the storage portion 6. In addition, the determining portion 7 can compare a voltage of one of the parallel battery units detected by the detecting portion 5 is compared with a voltage of other of the parallel battery units to detect the voltage difference, and can determine that a battery cell internal short circuit occurs in the one of the parallel battery units if the voltage difference is larger than a predetermined value.

(Battery Pack 10)

The battery pack 10 powers the electric motor 52 for driving the vehicle via the DC/AC inverter 51. In order to supply a large amount of electric power to the electric motor 52, the battery pack 10 includes a plurality of parallel battery units 1 each of which includes a plurality of battery cells 2 that are connected to each other in parallel. The parallel battery units 1 are serially connected to each other whereby providing high output voltage. Nickel-hydrogen batteries or lithium-ion rechargeable batteries can be used as the battery cells 2. However, any rechargeable batteries including nickel-cadmium rechargeable batteries may be as the battery. To supply a large amount of electric power to the electric motor 52, the output voltage of the battery pack 10 can be set at a value of 100 to 400 V, for example.

(Contactor 11)

The contactors 11 are connected on the positive and negative output sides of the battery pack 10 in the power supply device 100 shown FIG. 1. The contactors 11 are ON, when the vehicle is in operation, in other words, when the ignition switch of the vehicle is turned ON. The contactors 11 are OFF, when the vehicle is not in operation. Although the contactors 11 are connected on the positive and negative output sides of the battery pack 10 in the power supply device 100 shown in FIG. 1, only one contactor may be connected on the positive or negative output side.

(Internal Short Circuit Detection Method)

According to the aforementioned construction, the battery system can detect a very small internal short circuit in the battery system that includes the battery pack having the battery cells 2 connected to each other in parallel. The following description will describe the procedure of detecting the very small internal short circuit with reference to a flowchart of FIG. 2.

At Step S1, first, voltage and current values of the parallel battery units 1 are actually detected by the detecting portion 5. In this embodiment, the voltage detecting circuit 4 of the detecting portion 5 detects voltage values of the parallel battery units 1 each of which includes the battery cell 2 connected to each other in parallel. The current detecting circuit 3 detects a current value flowing in the parallel battery units 1. The voltage and current values are detected periodically at a predetermined interval or at predetermined timing. For example, the voltage and current values can be detected periodically at a predetermined interval within a range of 0.01 to 5 seconds.

Subsequently, at Step S2, current values can be accumulated to calculate the battery remaining capacity (SOC: State of Charge) if necessary. This SOC calculation is executed by the detecting portion 5. The obtained voltage value and current integrated value are stored as actually-detected remaining capacities of the parallel battery units 1 as time-series data in the temporary storage area 6b of the storage portion 6. Accumulated values may be used in stead of SOC in calculation and determination. This step can be skipped in the case where accumulated current values are not required.

Subsequently, at Step S3, the parallel battery unit 1 reference voltage corresponding to the accumulated value is read from the storage portion 6. In this embodiment, the corresponding value is read from the reference data that is previously stored in the reference area 6a of the storage portion 6, and represents the relationship between voltage value variation and current accumulated value variation.

After that, in Step S4, the determining portion 7 compares the read reference value with the actually-detected value of the parallel battery unit 1. In this embodiment, the determining portion 7 reads the reference value corresponding to the current accumulated value variation obtained based on the actually-detected value, which will be voltage variation in the normal condition, from the storage portion 6, and then compares the read reference value with the voltage variation obtained based on the actually-detected values. After that, it is determined whether the difference between the read reference value and the voltage variation obtained based on the actually-detected values exceeds a predetermined threshold value. If this difference is larger than the predetermined value, the procedure goes to Step S5 in that it is determined that a battery cell 2 internal short circuit occurs, and in that the control portion 8 or the like can take required actions. If that difference is smaller than the predetermined value, it is not determined that an internal short circuit occurs, and the procedure returns to Step S1. Thus, the foregoing steps are repeated. Thus, conventionally, it has been difficult to detect an internal short circuit in battery cells that are connected to each other in parallel, this battery system can effectively detect an internal short circuit in battery cells that are connected to each other in parallel.

Although the determining portion has been described that uses the current accumulated value, the determining portion can compare a voltage of one of the parallel battery units with voltages of other of the parallel battery units to detect the voltage difference, and can determine that an internal short circuit occurs in the one of the parallel battery units if the voltage difference is larger than a predetermined value.

Conventionally, in a battery system that includes a plurality of battery cells connected to each other in parallel, if an internal short circuit occurs in one or more battery cell among the battery cell, since currents flow from other battery cells into the internally short-circuited battery cell, it is difficult to detect the internal short circuit only based on the voltage value variation. If a short circuit occurs caused by a metal fragment that enters a battery cell case, such a strong short circuit will result in a large amount of battery cell drop. Accordingly, a parallel battery unit having the internally short-circuited battery is discharged. As a result, the voltage of the parallel battery unit will be substantially zero. For this reason, it is possible to easily detect such a strong short circuit.

Contrary to this, even if an extremely small short circuit occurs, voltage will only gradually decrease. Such gradual voltage decrease may not cause a serious safety problem. From this viewpoint, it can be said that detection of an extremely small short circuit is not necessary. Although it is difficult to detect a relatively small short circuit between such an extremely small short circuit and a strong short circuit, such a relatively small short circuit may cause heat generation if remaining for a long time. Accordingly, such a relatively small short circuit may cause a safety problem. For this reason, it is not preferable that such a relatively small short circuit remains. Therefore, a certain method for detecting such a relatively small short circuit has been desired. In the aforementioned power supply device, the variation of the capacity or voltage of the parallel battery unit is monitored. Also, the variation of the capacity or voltage expected in the normal condition is previously recorded. Accordingly, abnormalities can be determined by comparing the monitored variation and the expected variation. In other words, based on calculation charging/discharging currents flowing in the battery cells of the parallel battery unit, deviation is monitored between the expected capacity or voltage variation and the calculated capacity or voltage variation whereby detecting abnormalities when the monitored deviation exceeds a predetermined threshold value. Therefore, a safe battery system can be constructed.

The vehicle power supply device can be installed on electric vehicles such as hybrid cars that are driven by both an engine and an electric motor, and electric vehicles that are driven only by a electric motor. The power supply device can be used as a power supply device for these types of vehicles.

Figure 3:
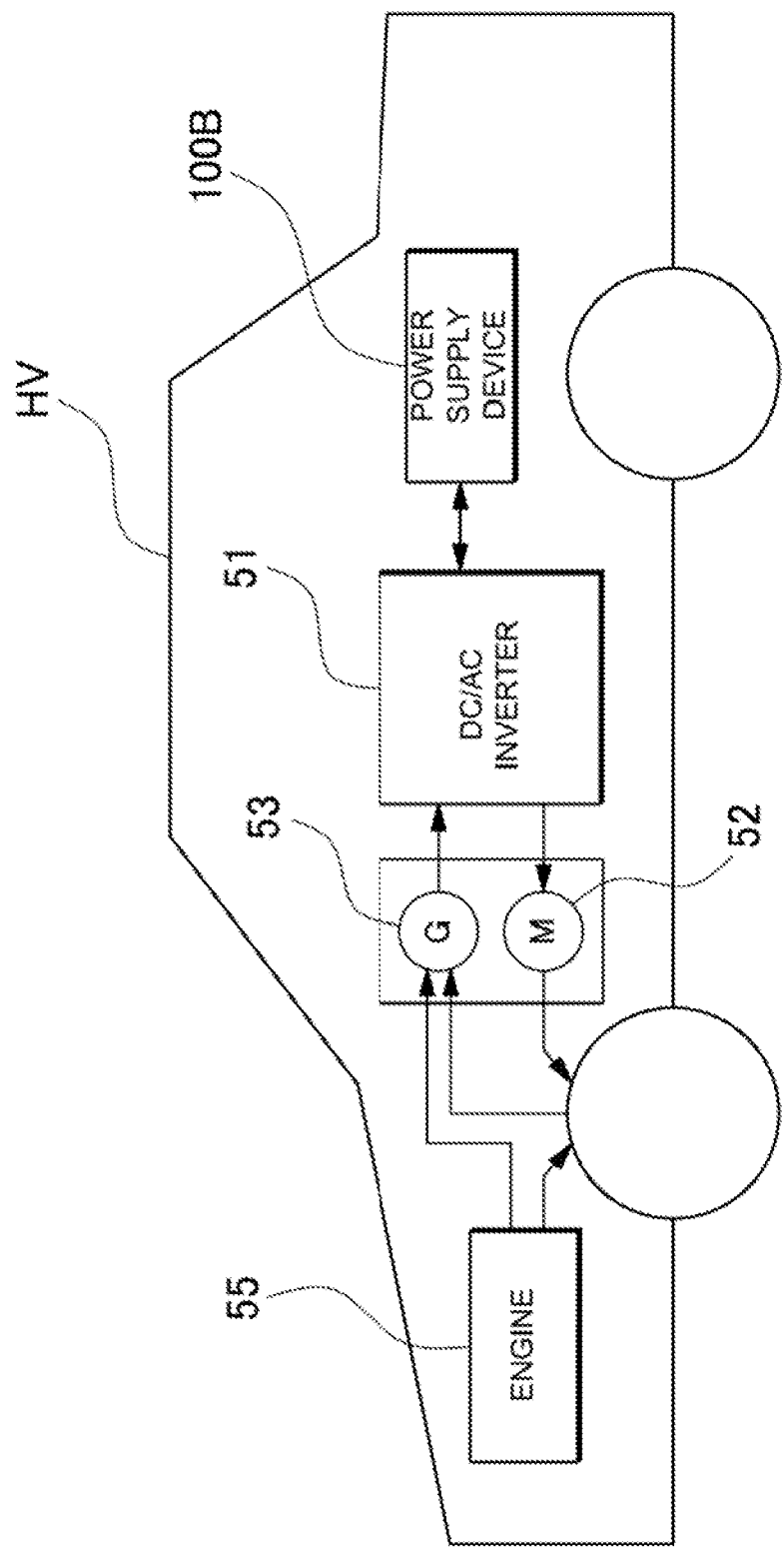
FIG. 3 is a block diagram showing an exemplary hybrid car that is driven by an engine and an electric motor, and includes the power supply device.

FIG. 3 is a block diagram showing an exemplary hybrid car that is driven both by an engine 55 and an electric motor 52, and includes the vehicle power supply device 100. The illustrated vehicle HV includes the electric motor 52 and the engine 55 that drive the vehicle HV, the vehicle power supply device 100B that supplies electric power to the electric motor 52, and an electric generator 53 that charges batteries of the vehicle power supply device 100B. The vehicle power supply device 100B is connected to the electric motor 52 and the electric generator 53 via a DC/AC inverter 51. The vehicle HV is driven both by the electric motor 52 and the engine 55 with the batteries of the vehicle power supply device 100B being charged/discharged. The electric motor 52 is energized and drives the vehicle in a poor engine efficiency range, e.g., in acceleration or in a low speed range. The electric motor 52 is energized by electric power is supplied from the vehicle power supply device 100B. The electric generator 53 is driven by the engine 55 or by regenerative braking when users brake the vehicle so that the batteries of the vehicle power supply device 100B are charged.

Figure 4:
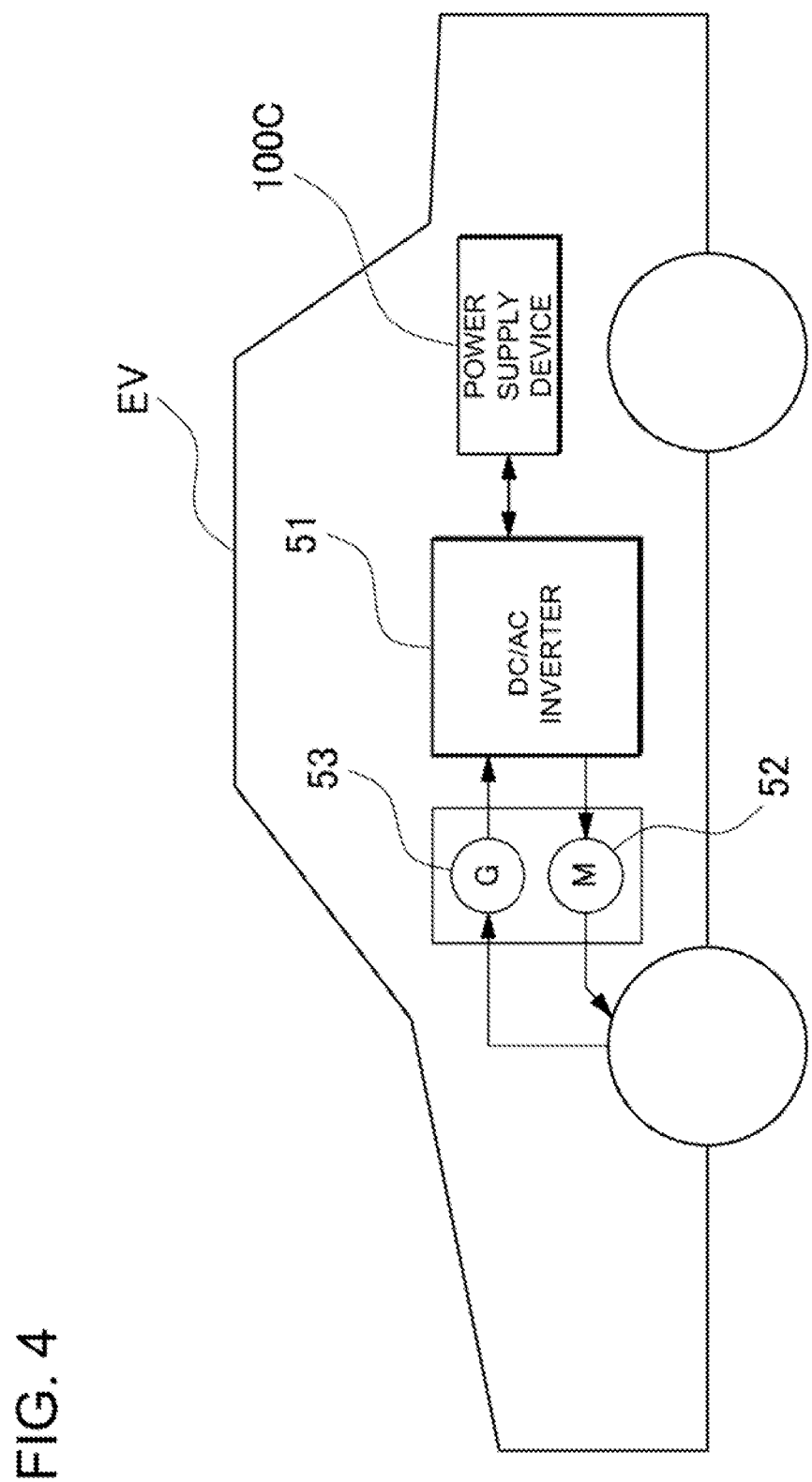
FIG. 4 is a block diagram showing an exemplary electric vehicle that is driven only by an electric motor, and includes the power supply device.
Figure 5:
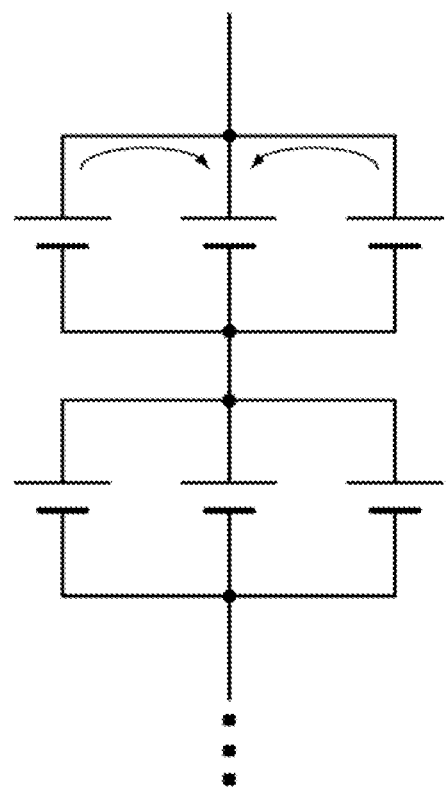
FIG. 5 is a schematic diagram showing parallel battery units, with an internal short circuit occurring in one of battery cells connected to each other in parallel in one of the parallel battery units.

FIG. 4 shows an exemplary electric vehicle that is driven only by an electric motor 52, and includes the vehicle power supply device 100C. The illustrated vehicle EV includes an electric motor 52 that drives the vehicle EV, the vehicle power supply device 100C that supplies electric power to the electric motor 52, and an electric generator 53 that charges batteries of the vehicle power supply device 100C. The electric motor 52 is energized by electric power is supplied from the vehicle power supply device 100C. The electric generator 53 can be driven by vehicle EV regenerative braking so that the batteries of the vehicle power supply device 100C are charged.

Industrial Applicability

A battery system, and a method for detecting an internal short circuit in a battery system according to the present invention can be suitably applied to power supple devices of plug-in hybrid vehicles and hybrid electric vehicles that can switch between the EV drive mode and the HEV drive mode, electric vehicles, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2009-291490 filed in Japan on Dec. 22, 2009, the content of which is incorporated herein by reference.

What is claimed is:

1. A battery system, comprising:
   a battery pack that includes parallel battery units, each of the parallel battery units including a plurality of battery cells connected to each other in parallel, and the plurality of parallel battery units being serially connected to each other to form the battery pack;
   a storage portion that stores reference data regarding a relationship between reference voltage values and accumulated current values, the reference data being previously obtained based on measured experimental results and the accumulated current values being current integrated values;
   a detecting portion that detects voltage and current of each of the parallel battery units, and calculates an accumulated current value of each of the parallel battery units based on the detected current of each of the parallel battery units;
   a determining portion that reads, from the reference data in the storage portion, one of the reference voltage values corresponding to the accumulated current value of each of the parallel battery units detected by the detecting portion, and compares the read reference voltage value with the detection voltage of each of the parallel battery units detected by the detecting portion,
   wherein the determining portion is configured to determine that the parallel battery unit includes a battery cell where an internal short circuit occurs if a difference between the read reference voltage value and the detection voltage of the parallel battery unit is larger than a predetermined value.

2. The battery system according to claim 1, wherein the detecting portion detects the accumulated current value of the current of each of the parallel battery units for a predetermined time period, a period from a start to an end of charging operation, a period from a start to an end of discharging operation, or a period in that the accumulated current value of the current of each of the parallel battery units reaches a predetermined value so that it is determined whether a battery cell internal short circuit occurs.

3. The battery system according to claim 1, wherein the accumulated value of the current of each of the parallel battery units detected by the detecting portion is a remaining capacity that is obtained by multiplying an integrated value of the current by a correction coefficient.

4. The battery system according to claim 1, wherein the battery cells are lithium-ion rechargeable batteries.

5. The battery system according to claim 1, wherein the battery pack is a power supply that supplies electric power to an electric motor for driving a vehicle.

6. The battery system according to claim 2, wherein the accumulated value of the current of each of the parallel battery units detected by the detecting portion is a remaining capacity that is obtained by multiplying an integrated value of the current by a correction coefficient.

7. A battery cell internal short circuit detection method for detecting a battery cell internal short circuit in a battery system, the battery system comprising:

a battery pack having serially-connected parallel battery units, each of the parallel battery units including a plurality of battery cells connected to each other in parallel, and the plurality of parallel battery units being serially connected to each other to form the battery pack, and a storage portion that stores reference data regarding a relationship between reference voltage values and accumulated current values, the reference data being previously obtained based on measured experimental results and the accumulated current values being current integrated values;

wherein the method comprising the steps of:

detecting voltage and current of each of the parallel battery units by a detecting portion;

calculating the accumulated current value of each of the parallel battery units;

reading, from the reference data in the storage portion, one of the reference voltage values corresponding to the accumulated current value of each of the parallel battery units;

comparing the read reference voltage with the detection voltage of the each of the parallel battery units detected by the detecting portion; and determining that the parallel battery unit includes a battery cell where an internal short circuit occurs if a difference between the read reference voltage value and the detection voltage of the parallel battery unit is larger than a predetermined value.

* * * * *